United States Patent
Wang (12) 
(10) Patent No.: US 6,720,777 B2
(45) Date of Patent: Apr. 13, 2004

(54) BRIDGED CAPACITOR SENSOR MEASUREMENT CIRCUIT

(75) Inventor: Rongtai Wang, Edina, MN (US)

(73) Assignee: Rosemount Inc., Eden Prairie, MN (US)

( * ) Notice: Subject to any disclaimer, the term of this patent is extended or adjusted under 35 U.S.C. 154(b) by 115 days.

(21) Appl. No.: 10/077,402

(22) Filed: Feb. 15, 2002

(65) Prior Publication Data

US 2003/0155936 A1 Aug. 21, 2003

(51) Int. Cl.[7] .............................................. G01R 27/26
(52) U.S. Cl. .................... 324/680; 324/658; 324/686
(58) Field of Search ................ 324/680, 658, 324/664, 686

(56) References Cited

U.S. PATENT DOCUMENTS

| | | | |
|---|---|---|---|
| 5,083,091 A | 1/1992 | Frick et al. | 324/678 |
| 5,194,819 A | 3/1993 | Briefer | 324/684 |
| 5,637,802 A | 6/1997 | Frick et al. | 73/724 |
| 5,661,240 A | 8/1997 | Kemp | 73/514.32 |
| 6,140,952 A | 10/2000 | Gaboury | 341/143 |

FOREIGN PATENT DOCUMENTS

| EP | 1 072 865 A2 | 1/2001 |
|---|---|---|
| WO | WO 00/70321 | 11/2000 |

OTHER PUBLICATIONS

E. Schrüfer, "Elektrische Meβtechnik", mit 410 Bildern und 36 Tabellen, pp. 384–386, 1995.

*Primary Examiner*—N. Le
*Assistant Examiner*—John Teresinski
(74) *Attorney, Agent, or Firm*—Westman, Champlin & Kelly, P.A.

(57) ABSTRACT

A pair of sensing capacitors, each having a capacitance $C_1$ and $C_2$ respectively, based on a process variable, are coupled to a bridge node which is coupled to a summing node. A reference capacitor, coupled to the summing node, has a capacitance $C_{REF}$ greater than an expected maximum difference between the capacitances of the pair of sensing capacitors. Switches selectively couple the sensing capacitors and the reference capacitor to at least first and second voltages to derive charges representative of $C_1-C_2$ and $C_{REF}$. In one embodiment the sensing capacitors are operated to charge and discharge during respective first and second phases of first cycles and the reference capacitor is operated to charge and discharge during respective first and second phases of second cycles. In another embodiment, the reference capacitor is operated to charge and discharge during alternate phases of the first and second cycles and the sensing capacitors are operated to charge and discharge during respective first and second phases of all cycles.

25 Claims, 4 Drawing Sheets

BRIDGED CAPACITOR SENSOR MEASUREMENT CIRCUIT

FIELD OF THE INVENTION

This invention relates to industrial process control transmitters, and particularly to apparatus that increases the stability of a differential sensor or sensor pair for such a transmitter.

BACKGROUND OF THE INVENTION

Industrial process control transmitters are used to measure process variables of fluids in an industrial process. Typically, these transmitters are placed in field locations and provide standardized transmission signals representing process variable of the monitored fluid, such as pressure. The fluids include slurries, liquids, vapors and gasses, in industrial process plants, such as chemical, pulp, petroleum, gas, pharmaceutical, food and other fluid processing plants. The monitored process variables can be pressure, temperature, flow, level, pH, conductivity, turbidity, density, concentration, chemical composition or other properties of fluids.

An industrial process control transmitter typically includes a sensor that senses the process variable, a measurement circuit that provides a measurement of the value of sensed process variable and a communication circuit that transmits the measurement information to another location. One example of a sensor employed in industrial process control transmitters is a capacitance sensor that measures pressure in the industrial process. One such sensor includes a pressure-responsive structure supporting a pair of capacitor plates that together define a capacitor sensor. Pressure applied to the structure deflects the relative positions of the plates to alter the capacitance between the plate as a measure of pressure. Conveniently, the capacitor plates are mounted in a cavity in the pressure-responsive structure so that pressure applied to one side of the structure deforms the cavity to deflect one of the plates. Also conveniently, the pressure-responsive structure is formed of sapphire or other corrosion-resistant, pressure-responsive material. One such sensor is described in U.S. Pat. No. 5,637,802 granted Jun. 10, 1997 to Frick et al. and assigned to the same assignee as the present invention.

The capacitor plates supported by the pressure-responsive material form an absolute pressure sensor. Nevertheless, as described in the Frick et al. patent, differential pressure, that is a difference between two pressures in the industrial process, is sensed by identifying a difference between the capacitances of two such sensors. The measurement circuit charges the capacitor plates and provides a measurement of differential pressure.

The measurement circuit may include a delta sigma converter (also called a sigma delta, $\Delta\Sigma$, or $\Sigma\Delta$ converter) that acts as a capacitance-to-digital converter. The delta sigma circuit may include one or two stages of integration; the circuit employing two stages of integration displays significantly reduced quantization noise in the measurement.

In the case of a differential capacitance ratio measurement, the measurement circuit provides a measurement output representative of the ratio of $(C_1-C_2)$ to some reference capacitance $C_{REF}$, $(C_1-C_2)/C_{REF}$. Unfortunately, such a converter system may become unstable. More particularly, the difference between the two capacitances may be either positive or negative, depending upon whether $C_2$ is larger or smaller than $C_1$. When the increment proportional to $(C_1-C_2)$ has the same polarity as the increment proportional to the reference capacitor $C_{REF}$, the system becomes a non-convergent integration system and is unstable. This can occur when $C_2$ is greater than $C_1$ and is true for both first-order and second-order capacitive-to-digital converters. Moreover, for a second-order capacitive-to-digital converter, there is a limitation on the ratio of $C_{REF}/|C_1-C_2|$. Since the value of $|C_1-C_2|$ may be arbitrarily small, the ratio of $C_{REF}/|C_1-C_2|$ can be arbitrarily large. If that ratio becomes too large, the output signal of the second stage of the delta sigma converter may saturate.

SUMMARY OF THE INVENTION

The present invention employs a reference capacitor that is larger than the expected maximum difference $|C_1-C_2|_{max}$ between the two capacitors of the differential pair. Consequently, the sign of the difference $C_1-C_2$ will not cause non-convergence of the integration process. Moreover, the value of the capacitance of $C_{REF}$ can be established such that the output signals of the converter will not saturate.

In accordance with the present invention, first sides of a pair of capacitor sensors are coupled at a bridge node and to the process variable to provide a differential capacitance representative of the process variable. A switch circuit selectively couples the capacitors to a first or second voltage to derive a representation of $C_1-C_2$ at the bridge node.

In preferred embodiments, the switch circuit includes a first switch selectively coupling the second side of the first capacitor to first and second voltage levels and a second switch selectively coupling the second side of the second capacitor to the first and second voltage levels. A switch control operates the first and second switches during a first phase to couple the first capacitor to the first voltage level and the second capacitor to the second voltage level and during a second phase to couple the second capacitor to the first voltage level and the first capacitor to the second voltage level.

In preferred embodiments, a summing node is coupled to the bridge node and a reference capacitor $C_{REF}$ is coupled to the summing node.

In one embodiment, the sensor capacitors and reference capacitor are operated during mutually exclusive first and second cycles to supply charges representative of $C_1-C_2$ and $C_{REF}$ to the summing node so that $$\frac{N_A}{N_B} = \frac{C_1 - C_2}{C_{REF}}$$

where $N_A$ and $N_B$ are the number of first and second cycles.

In another embodiment, the reference capacitor is operated oppositely during respective phases of first and second cycles and the sensors are operated oppositely during respective phases of all cycles to supply charges representative of $(C_1-C_2)-C_{REF}$ and $(C_1-C_2)+C_{REF}$ to the summing node so that $$\frac{N_A - N_B}{N_A + N_B} = \frac{C_1 - C_2}{C_{REF}}$$

where $N_A$ and $N_B$ are the number of first and second cycles.

DETAILED DESCRIPTION OF THE PREFERRED EMBODIMENTS

The principal problem addressed by the present invention is that prior differential converters were not always convergent, leading to instability. The present invention employs a reference capacitance that is larger than the expected maximum difference between the differential capacitors so that the converter is convergent and the integrator will not saturate.

Figure 1:
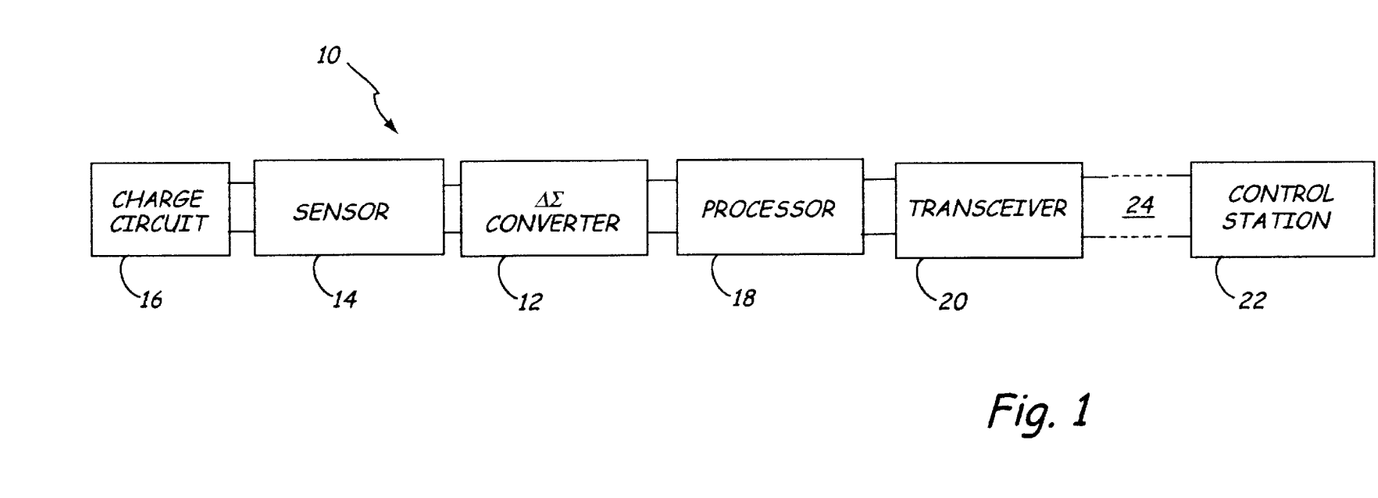
FIG. 1 is a block diagram of an industrial process control transmitter employing the measurement circuit according to an embodiment of the present invention.

FIG. 1 is a block diagram of an industrial process control transmitter 10 having a capacitance-to-digital converter 12, such as a delta sigma converter, arranged to receive signals representative of a pressure from sensor 14. Sensor 14 is a differential sensor that includes at least a pair of pressure sensitive capacitors that are charged by charge circuit 16. One example of sensor 14 is a pair of absolute pressure sensors as described in the aforementioned Frick et al. patent. Charges on the capacitors are representative of pressure and are transferred to converter 12 which converts the charges to digital signals. The digital signal output from converter 12 is processed by processor 18 and input to transceiver 20 which provides a standardized transmission signal in a protocol designed for transmission to central control station 22 by a two-wire communication link 24. Additionally, control station 22 may send signals to remote industrial process control transmitter 10 by communication link 24 which are received through transceiver 20 to provide control to transmitter 10 in a manner well known in the art.

One well-known class of industrial process control transmitters employs a metal differential sensor having a pair of capacitor sensors, $C_H$ and $C_L$, that are differentially arranged to measure a process variable, such as pressure. Each capacitor is charged by an excitation voltage VEX to supply plural charge packets Q during mutually exclusive time periods to a delta sigma converter. The delta sigma converter integrates the charge packets to derive a digital representation of the process variable based on the number N of charge packets from the capacitor sensors. The delta sigma converter operates on a charge balance equation $$N_H Q_H + N_L Q_L = 0,$$

where $Q_H = C_H V_{EX}$, $Q_L = -C_L V_{EX}$ and $$V_{EX} = V_{REF}^+ - V_{REF}^-.$$

Consequently, $N_H C_L = N_L C_H$, $$\frac{C_H}{C_L} = \frac{N_L}{N_H}$$

and $$\frac{C_H - C_L}{C_H + C_L} = \frac{N_L - N_H}{N_L + N_H}.$$

It will be appreciated by those skilled in the art that this class of transmitter requires that capacitor sensors $C_H$ and $C_L$ must be operated during mutually exclusive time periods.

Figure 2:
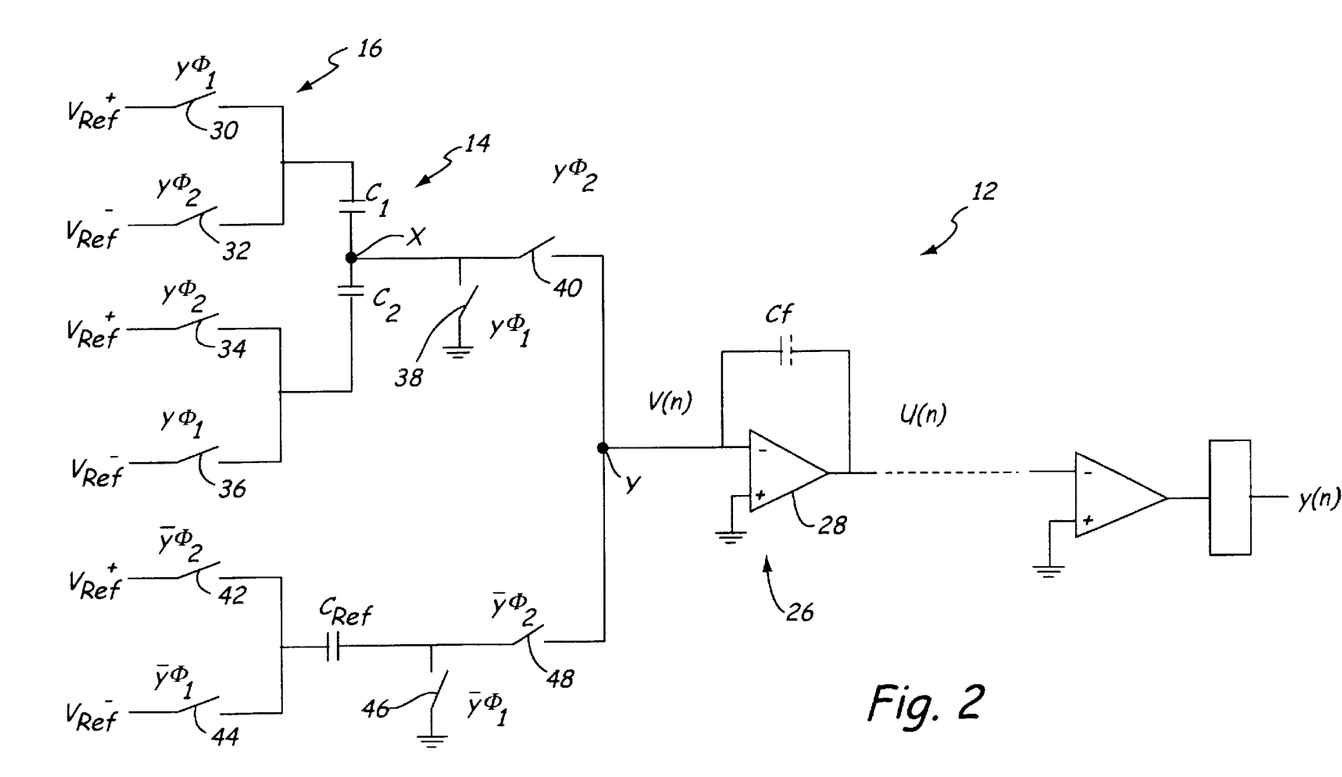
FIG. 2 is a circuit diagram of the input and first stage of a capacitance-to-digital converter having a bridged sensor.

FIG. 2 illustrates a bridged measurement circuit wherein the capacitor sensors are operated during first cycles to derive charge packets $Q_A$ representative of the difference in value of the two capacitance values. A reference capacitor is operated during mutually exclusive second cycles to the sensors to derive charge packets $Q_B$. The resulting charge balance equation is $$N_A Q_A + N_B Q_B = 0,$$

where $Q_A = V_{EX}(C_1 - C_2)$, $Q_B = -V_{EX} C_{REF}$, $N_A$ is the number of integration operations on $(C_1 - C_2)$, $N_B$ is the number of integration operations on $C_{REF}$, and $$V_{EX} = V_{REF}^+ - V_{REF}^-$$

Consequently, $$\frac{C_1 - C_2}{C_{REF}} = \frac{N_B}{N_A}.$$

The circuit illustrated in FIG. 2 includes a capacitive sensor 14, reference capacitor $C_{REF}$, charge circuit 16 and a converter 12 for an industrial process control transmitter, such as transmitter 10 (FIG. 1). Sensor 14 comprises a pair of capacitors $C_1$ and $C_2$ that provide input through bridge node X and summing node Y to the first stage 26 of a single- or two-stage capacitive-to-digital converter 12 of the delta sigma type. Reference capacitor $C_{REF}$ provides input through summing node Y to the first stage 26 of converter 12. Sensor 14 may be constructed as described in the aforementioned Frick et al. patent and may include guard electrodes and shields coupled to a common, or ground, voltage for purposes described in the Frick et al. patent.

Charge circuit 16 is controlled by digital signal y(n) from the output of converter 12. With y(n) high (e.g., y=1 as denoted by y), during a first phase yΦ$_1$ capacitor $C_1$ is coupled to reference voltage $$V_{REF}^+$$

due to the conducting condition of switch 30 and capacitor $C_2$ is coupled to reference voltage $$V_{REF}^-$$

due to the conducting condition of switch 36. Switch 38 couples the summing node Y to a common voltage, such as ground. Thus during phase yΦ$_1$, capacitor $C_1$ is charged to $$V_{REF}^+$$

and capacitor $C_2$ is charged to $$V_{REF}^-.$$

For example, if $$V_{REF}^+$$

is 1.25 volts DC, the voltage on the top plate (as shown in FIG. 2) of capacitor $C_1$ is +1.25 volts, the voltage on the bottom plate of capacitor $C_2$ is −1.25 volts, and the voltage at node X is ground or common.

During a second phase $y\Phi_2$, the top plate of capacitor $C_1$ is coupled to $$V_{REF}^-$$

(e.g., −1.25 volts) through switch 32, the bottom plate of capacitor $C_2$ is coupled to $$V_{REF}^+$$

(e.g., +1.25 volts) through switch 34, and the common voltage (e.g., ground) is removed from node X due to the non-conducting condition of switch 38. The voltage change (excitation voltage) to capacitor $C_1$ input node is −2.50 volts and the voltage change to capacitor $C_2$ input node is +2.50 volts. The charge transfer from capacitor $C_1$ output node X through node Y to integrator 26 is $-V_{EX}C_1$. Similarly, the charge transfer from capacitor $C_2$ output node X through node Y to integrator 26 is $+V_{EX}C_2$. Consequently, the net charge transfer from the sensor capacitor bridge output node X to integrator 26 is $Q_A = -V_{EX}(C_1 - C_2)$.

With y(n) low (e.g., y=0 as denoted by $\bar{y}$), during a first phase $\bar{y}\Phi_1$ the input side of reference capacitor $C_{REF}$ is coupled to reference voltage $$V_{REF}^-$$

due to the conducting condition of switch 44 and the output side of capacitor $C_{REF}$ is coupled to the common voltage due to the conducting condition of switch 46. During a second phase $\bar{y}\Phi_2$, the input side of reference capacitor $C_{REF}$ is coupled to $$V_{REF}^+$$

through switch 42. The charge transfer from reference capacitor $C_{REF}$ output node through node Y to integrator 26 is $Q_B = V_{EX}C_{REF}$.

Amplifier 28 and feedback capacitor $C_F$ form a negative integrator stage 26. If a negative (or positive) charge is transferred to the integrator, a positive (or negative) voltage step will be created at the output of integrator 26. Integrator stage 26 integrates the inputs over a number N of sample cycles. The output from stage 26 is a signal that steps positively or negatively for each y or $\bar{y}$ cycle over the period of N cycles, thereby forming the digital conversion. For example, if the charge transfer from capacitors $C_1-C_2$ is negative, the output voltage U(n) will increase positively in steps during each y cycle, each step being representative of the difference in capacitance values of $C_1-C_2$. The charge transfer from capacitor $C_{REF}$ is positive, causing the output voltage U(n) to decrease (increase negatively) in steps during each $\bar{y}$ cycle, each step being representative of the value of reference capacitance $C_{REF}$. Therefore, $$N_A(C_1-C_2)-N_B C_{REF}=0,$$

where $N_A$ is the number of integration operations on $(C_1-C_2)$ when y=1, and $N_B$ is the number of integration operations on $C_{REF}$ when y=0. Consequently, $$\frac{C_1-C_2}{C_{REF}}=\frac{N_B}{N_A}.$$

Since the total number of integration steps is constant N, $N=N_A+N_B$, and the relationship $$\frac{C_1-C_2}{C_{REF}}$$

can be calculated from the number of integration steps during y=1 alone as $$\frac{C_1-C_2}{C_{REF}}=\frac{N}{N_A}-1.$$

The system illustrated in FIG. 2 offers an advantage that the process variable measurement can be calculated based solely on the number ($N_A$) of integration steps during the y=1 cycles. However, the system may exhibit instability if the value of capacitor $C_2$ is larger than the value of capacitor $C_1$. More particularly, the principal reason for instability is that the difference of the two capacitances, $(C_1-C_2)$ can be either positive or negative, depending upon whether $C_2$ is larger or smaller than $C_1$. (This risk might not arise in the case of metal differential sensor capacitance ratio measurement where both capacitors ($C_H$ and $C_L$) are positive.)

It is also evident that the difference between capacitances $C_1$ and $C_2$ may be small compared to the reference capacitor. It is also clear that if $|C_1-C_2|$ is arbitrarily small, $C_{REF}/|C_1-C_2|$ can be arbitrarily large. If the ratio of $C_{REF}/|C_1-C_2|$ is large, the output W(n) of the second stage of the converter may saturate (sometimes called "hitting the rail").

Figure 3:
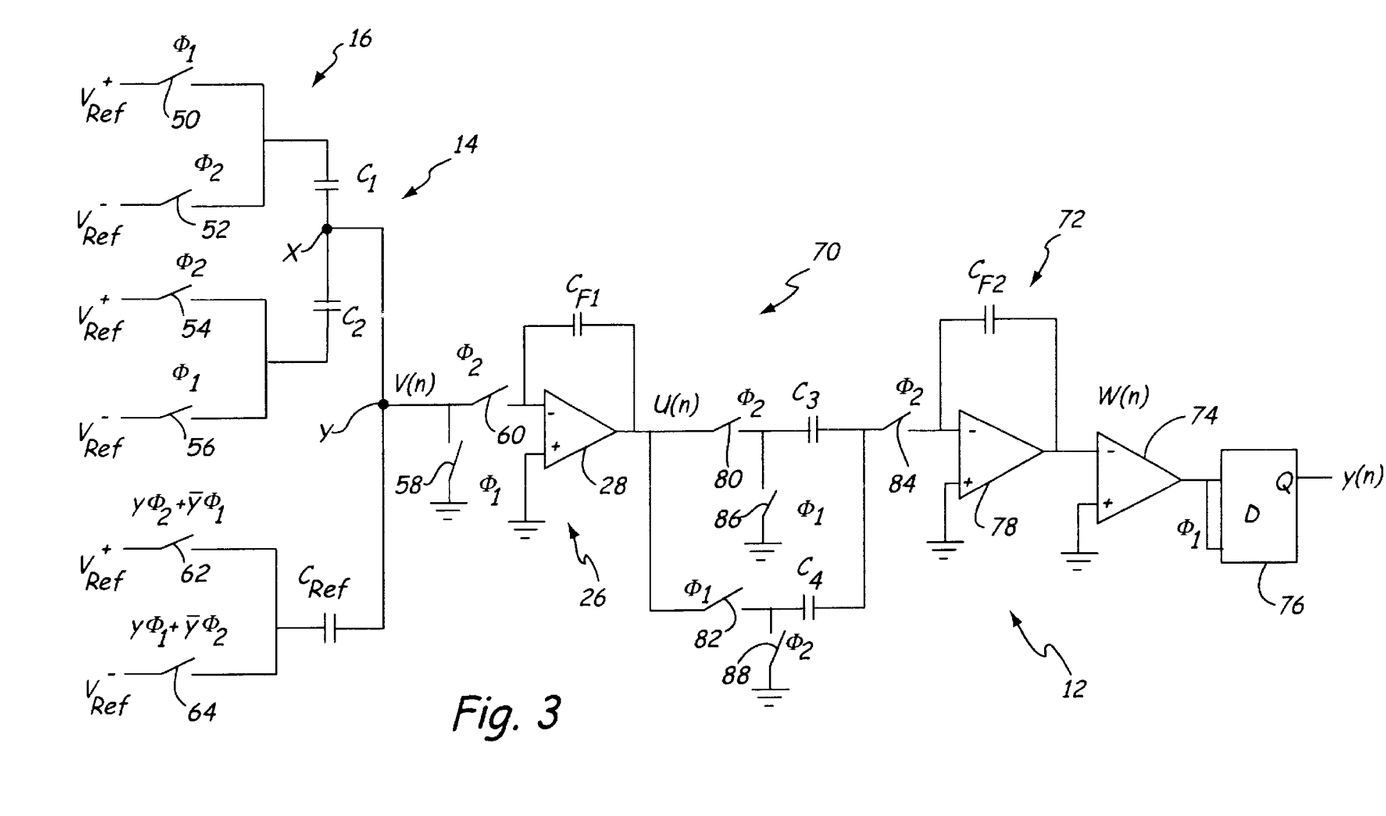
FIG. 3 is a circuit diagram of the input and first and second stages of a differential capacitance-to-digital converter in accordance with a preferred embodiment of the present invention.

FIG. 3 illustrates a bridged measurement circuit in accordance with the presently preferred embodiment of the present invention. In FIG. 3, the circuit operates on a charge balance equation $$N_A Q_A + N_B Q_B = 0,$$

where $Q_A = -V_{EX}[(C_1-C_2)-C_{REF}]$, $Q_B = -V_{EX}[(C_1-C_2)+C_{REF}]$, $N_A$ is the number of integration cycles on $Q_A$ and $N_B$ is the number of integration cycles on $Q_B$. Consequently, $$(N_A+N_B)(C_1-C_2)=(N_A-N_B)C_{REF},$$

and $$\frac{C_1-C_2}{C_{REF}}=\frac{N_A-N_B}{N_A+N_B}=\frac{2N_A}{N}-1,$$

where $N=N_A+N_B$. Moreover, by choosing $C_{REF} > |C_1-C_2|_{max}$ (the maximum value of $|C_1-C_2|$) $Q_A$ and $Q_B$ are always in opposite polarity so the integrator is convergent and the system is stable.

The circuit illustrated in FIG. 3 includes a capacitive sensor 14, reference capacitor $C_{REF}$, charge circuit 16 and a converter 12 for an industrial process control transmitter, such as transmitter 10 (FIG. 1). Sensor 14 comprises a pair of capacitors $C_1$ and $C_2$ that provide input through bridge node X and summing node Y to the first stage 26 of a single- or two-stage capacitive-to-digital converter 12 of the delta sigma type. Reference capacitor $C_{REF}$ provides input through summing node Y to the first stage 26 of converter 12. Sensor 14 may be constructed as described in the aforementioned Frick et al. patent and may include guard electrodes and shields coupled to a common, or ground, voltage for purposes described in the Frick et al. patent.

During a first phase $\Phi_1$ capacitor $C_1$ is coupled to reference voltage $$V_{REF}^+$$

due to the conducting condition of switch 50 and capacitor $C_2$ is coupled to reference voltage $$V_{REF}^-$$

due to the conducting condition of switch 56. Switch 58 couples nodes X and Y to a common voltage, such as ground. Thus during phase $\Phi_1$, capacitor $C_1$ is charged to $$V_{REF}^+$$

and capacitor $C_2$ is charged to $$V_{REF}^-.$$

For example, if $$V_{REF}^+$$

is 1.25 volts DC, the voltage on the top plate (as shown in FIG. 3) of capacitor $C_1$ is +1.25 volts, the voltage on the bottom plate of capacitor $C_2$ is −1.25 volts, and the voltage at node X is ground or common.

During a second phase $\Phi_2$, the top plate of capacitor $C_1$ is coupled to $$V_{REF}^-$$

(e.g., −1.25 volts) through switch 52, the bottom plate of capacitor $C_2$ is coupled to $$V_{REF}^+$$

(e.g., +1.25 volts) through switch 54, and the common voltage (e.g., ground) is removed from nodes X and Y due to the non-conducting condition of switch 58. The voltage change (excitation voltage) to capacitor $C_1$ is −2.50 volts and the voltage change to capacitor $C_2$ is +2.50 volts. The charge transfer from capacitor $C_1$ output node X through node Y to integrator 26 is $-V_{EX}C_1$. Similarly, the charge transfer from capacitor $C_2$ output node X through node Y to integrator 26 is $V_{EX}C_2$. Consequently, the net charge transfer from the sensor capacitor bridge output node X to the integrator is $-V_{EX}(C_1-C_2)$.

Noteworthy, in this embodiment the charge transfer from the sensor bridge $-V_{EX}(C_1-C_2)$ is independent of the digital control signal y(n) from the output converter 12. However, the charge transfer on the reference capacitor side from $C_{REF}$ is controlled by the digital signal y(n). More particularly, during a first phase with y(n) low (e.g., y=0 as denoted by $\bar{y}$) $\bar{y}\Phi_1$, the input side of reference capacitor $C_{REF}$ is coupled to reference voltage $$V_{REF}^+$$

due to the conducting condition of switch 62 and the output side of capacitor $C_{REF}$ is coupled to the common voltage due to the conducting condition of switch 58. Thus during phase $\bar{y}\Phi_1$, reference capacitor $C_{REF}$ is charged to $$V_{REF}^+.$$

During a second phase $\bar{y}\Phi_2$, the input side of reference capacitor $C_{REF}$ is coupled to $$V_{REF}^-$$

through switch 64, generating an excitation voltage of $$-V_{EX} = V_{REF}^- - V_{REF}^+.$$

A negative charge $-V_{EX}C_{REF}$ based on the value of $C_{REF}$ and the excitation voltage is supplied to summing node Y where it is combined with the charge from capacitors $C_1$ and $C_2$ and applied through switch 60 to the negative input of amplifier 28 in the first stage 26 of converter 12.

Similarly, during a first phase with y(n) high (e.g., y=1 as denoted by y) $y\Phi_1$, the input side of reference capacitor $C_{REF}$ is coupled to reference voltage $$V_{REF}^-$$

due to the conducting condition of switch 62 and the output side of capacitor $C_{REF}$ is coupled to the common voltage due to the conducting condition of switch 58. Thus during phase $y\Phi_1$, reference capacitor $C_{REF}$ is charged to $$V_{REF}^-.$$

During a second phase $y\Phi_2$, the input side of reference capacitor $C_{REF}$ is coupled to $$V_{REF}^+$$

through switch 64, generating an excitation voltage of $$V_{EX} = V_{REF}^+ - V_{REF}^-.$$

A positive charge $V_{EX}C_{REF}$ based on the value of $C_{REF}$ and the excitation voltage is supplied to summing node Y where it is combined with the charge from capacitors $C_1$ and $C_2$ and applied through switch 60 to the negative input of amplifier 28 in the first stage 26 of converter 12.

The charge package $-V_{EX}(C_1-C_2)$, representative of the difference in capacitance values $(C_1-C_2)$, is applied during all of the cycles (y and $\bar{y}$), while the charge package representative of capacitor $C_{REF}$ is $V_{EX}C_{REF}$ or $-V_{EX}C_{REF}$ depending on whether the digital control signal is high (y=1) or low (y=0). When y=1, the net charge transfer from the sensor bridge and reference capacitor is $Q_A=-V_{EX}(C_1-C_2)+V_{EX}C_{REF}$. When y=0, the net charge transfer from the sensor bridge and reference capacitor is $Q_B=-V_{EX}(C_1-C_2)-V_{EX}C_{REF}$. If the capacitance value of $C_{REF}$ is chosen as greater than the maximum value of $|C_1-C_2|$, $C_{REF}>|C_1-C_2|_{MAX}$, charge package $Q_A$ will always be positive while charge package $Q_B$ will always be negative.

Amplifier 28 and feedback capacitor $C_F$ form an inverted integrator. If a negative charge package is transferred to the integrator, a positive voltage step is generated at the integrator output; if a positive charge package is transferred to the integrator, a negative voltage step is generated at the integrator output. Stage 26 integrates the inputs over a number N of sample cycles. The output from stage 26 is a signal that steps positively or negatively for each y or $\bar{y}$ cycle over the period of N cycles, thereby forming the digital conversion. For example, during each $\bar{y}$ cycle, the net charge from the bridge network and reference capacitor $C_{REF}$ is negative, so the output voltage U(n) will increase positively in steps. During each y cycle, the net charge from the bridge network and reference capacitor $C_{REF}$ is positive, so the output voltage U(n) will decrease (increase negatively) in steps.

To suppress quantization noise, a second order modulator may be used. In this case the output U(n) of the first stage is applied through a signal switch network 70 to the input of the second stage 72 of converter 12. The output W(n) of the second stage is coupled to an input of comparator 74, which supplies an input to D-type flip-flop 76 to derive the logic signal y(n). In the second stage integrator input, capacitor $C_3$ is coupled by switch 80, and capacitor $C_4$ is coupled by switch 82, to the output U(n) from amplifier 28. The opposite sides of both capacitors $C_3$ and $C_4$ are coupled through switch 84 to the negative input of amplifier 78. The input sides of both capacitors are also coupled to ground or common through respective switches 86 and 88. To achieve optimal effect to suppress quantization noise, $$\frac{C_4}{C_{F2}} = \frac{1}{2}\frac{C_3}{C_{F2}}.$$

In the embodiment of FIG. 3, the charge balance equation is $$N_A Q_A + N_B Q_B = 0,$$

where $Q_A=-V_{EX}[(C_1-C_2)-C_{REF}]$, $Q_B=-V_{EX}[(C_1-C_2)+C_{REF}]$, $N_A$ is the number of integration cycles y on $-C_{REF}$ and $N_B$ is the number of integration cycles $\bar{y}$ on $+C_{REF}$. Consequently, the charge balance equation leads to $$N_A[(C_1-C_2)-C_{REF}]+N_B[(C_1-C_2)+C_{REF}]=0.$$

Consequently, $$\frac{C_1-C_2}{C_{REF}} = \frac{2N_A}{N} - 1,$$

where $N=N_A+N_B$. As long as the value of $C_{REF}$ is greater than an expected maximum value of $|C_1-C_2|$, $(C_1-C_2)-C_{REF}$ will always be negative and the system is convergent.

Figure 4:
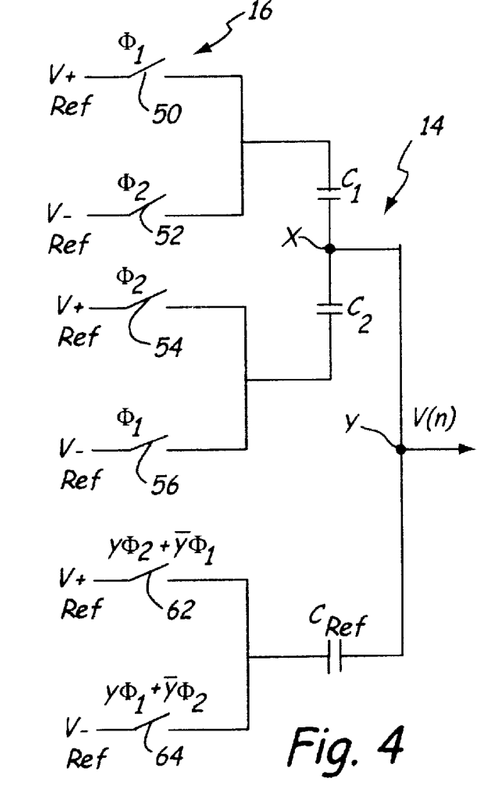
FIGS. 4 and 5 are circuit diagrams illustrating modifications of the input of the converter illustrated in FIG. 3.
Figure 5:
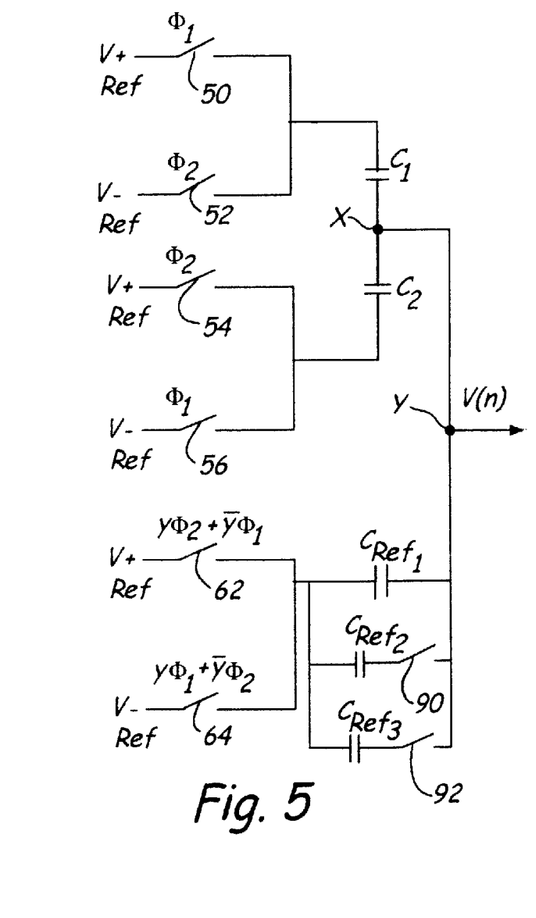

FIG. 4 illustrates a charge circuit 16 and FIG. 5 illustrates a reference capacitor $C_{REF}$ in accordance with modifications of the present invention. In FIG. 4, sensor capacitors $C_1$ and $C_2$ are coupled to reference voltage sources $$V_{REF}^+ \text{ and } V_{REF}^-$$

through switches 50, 52, 54 and 56 as described in connection with FIG. 3. In this case, the input of reference capacitor $C_{REF}$ is connected to a programmable voltage source $$V_{PROG}^+ \text{ and } V_{PROG}^-$$

through switches 62 and 64. The programmable voltage source is programmable by the user or by computer. Consequently, the value of the charges applied by reference capacitor $C_{REF}$ can be adjusted, such as for various sensing ranges for the measurement circuit.

The charge from reference capacitor $C_{REF}$ can alternatively be programmed using parallel reference capacitors $C_{REF1}$, $C_{REF2}$, $C_{REF3}$, etc. as shown in FIG. 5. One of the reference capacitors, $C_{REF}$, is permanently coupled in the circuit, whereas the other reference capacitors $C_{REF2}$, $C_{REF3}$, etc. are selectively coupled to node Y through switches 90, 92, etc. Consequently, the charge transfer due to the reference capacitor network may be selectively adjusted.

The present invention thus provides an industrial process control transmitter that is convergent, thereby avoiding instability associated with prior transmitters. While the invention is described in association with a pair of capacitor sensors having pressure-responsive structures, the invention is useful with other sensors, including sensors with pressure-responsive diaphragms.

Although the present invention has been described with reference to preferred embodiments, workers skilled in the art will recognize that changes may be made in form and detail without departing from the spirit and scope of the invention.

What is claimed is:

1. Apparatus for measuring a process variable comprising:
    a first sensing capacitor having a capacitance, $C_1$, based on the process variable;
    a second sensing capacitor having a capacitance, $C_2$, based on the process variable;
    a bridge node coupling a first side of the first sensing capacitor to a first side of the second sensing capacitor;
    an excitation source supplying at least first and second voltage levels;
    a reference capacitor having a capacitance, $C_{REF}$, greater than an expected maximum difference between the capacitances of the first and second sensing capacitors;
    a summing node coupled to a first side of the reference capacitor and the bridge node; and
    a switch circuit selectively coupling a second side of each of the first and second sensing capacitors to the excitation source to derive a representation of $C_1-C_2$ at the bridge node and selectively coupling a second side of the reference capacitor to the excitation source to derive first and second charges at the summing node during mutually exclusive cycles.

2. Apparatus according to claim 1, wherein the switch circuit comprises:
    a first switch selectively coupling the second side of the first sensing capacitor to the first and second voltage levels,
    a second switch selectively coupling a second side of the second sensing capacitor to the first and second voltage levels, and a switch control coupled to operate the first and second switches during a first phase to couple the first sensing capacitor to the first voltage level and the second sensing capacitor to the second voltage level, and to operate the first and second switches during a second phase to couple the first sensing capacitor to the second voltage level and the second sensing capacitor to the first voltage level.

3. Apparatus according to claim 1, wherein the switch circuit comprises:
 a first switch selectively coupling the second side of the first sensing capacitor to the first and second voltage levels,
 a second switch selectively coupling a second side of the second sensing capacitor to the first and second voltage levels, and
 a third switch selectively coupling a second side of the reference capacitor to one of two voltage levels of the excitation source.

4. Apparatus according to claim 3, further including a switch control coupled to the first, second and third switches and so disposed and arranged to
 operate the third switch to couple the reference capacitor to one voltage level during the first phase of a first cycle and during the second phase of a second cycle, and couple the reference capacitor to another voltage level during the first phase of the second cycle and during the second phase of the first cycle,
 operate the first and second switches to couple the first sensing capacitor to the first voltage level and the second sensing capacitor to the second voltage level during a first phase of each cycle, and
 operate the first and second switches to couple the first sensing capacitor to the second voltage level and the second sensing capacitor to the first voltage level during a second phase of each cycle.

5. Apparatus according to claim 4, wherein the switch control operates the first, second and third switches through $N_A$ first cycles and $N_B$ second cycles such that an integrated charge supplied by the first and second sensing capacitors balances an integrated charge supplied by the reference capacitor, and $$\frac{C_1 - C_2}{C_{REF}} = \frac{N_A - N_B}{N_A + N_B}.$$

6. Apparatus according to claim 3, further including a switch control coupled to the first, second and third switches and so disposed and arranged to
 operate the first and second switches to couple the first sensing capacitor to the first voltage level and the second sensing capacitor to the second voltage level during a first phase of a first cycle,
 operate the first and second switches to couple the first sensing capacitor to the second voltage level and the second sensing capacitor to the first voltage level during a second phase of the first cycle, and
 operate the third switch to couple the reference capacitor to one voltage level during the first phase of a second cycle, and couple the reference capacitor to another voltage level during the second phase of the second cycle.

7. Apparatus according to claim 6, wherein the switch control operates the first, second and third switches through $N_A$ first cycles and $N_B$ second cycles such that an integrated charge supplied by the first and second sensing capacitors balances an integrated charge supplied by the reference capacitor, and $$\frac{C_1 - C_2}{C_{REF}} = \frac{N_B}{N_A}.$$

8. Apparatus according to claim 3, wherein the excitation source includes a programmable voltage source, the programmable voltage source being programmable to supply the two voltage levels to the reference capacitor.

9. Apparatus according to claim 3, wherein the reference capacitor comprises an array of a plurality of capacitors, and a fourth switch selectively couples capacitors of the array in parallel.

10. Apparatus according to claim 1, further including a switch control coupled to the switch circuit and so disposed and arranged to
 operate the switch circuit to couple the reference capacitor to one voltage level during the first phase of a first cycle and during the second phase of a second cycle, and couple the reference capacitor to another voltage level during the first phase of the second cycle and during the second phase of the first cycle,
 operate the switch circuit to couple the first sensing capacitor to the first voltage level and the second sensing capacitor to the second voltage level during a first phase of each cycle, and
 operate the switch circuit to couple the first sensing capacitor to the second voltage level and the second sensing capacitor to the first voltage level during a second phase of each cycle.

11. Apparatus according to claim 10, wherein the switch control operates the switch circuit through $N_A$ first cycles and $N_B$ second cycles such that an integrated charge supplied by the first and second sensing capacitors balances an integrated charge supplied by the reference capacitor, and $$\frac{C_1 - C_2}{C_{REF}} = \frac{N_A - N_B}{N_A + N_B}.$$

12. Apparatus according to claim 1, further including a switch control coupled to the switch circuit and so disposed and arranged to
 operate the switch circuit to couple the first sensing capacitor to the first voltage level and the second sensing capacitor to the second voltage level during a first phase of a first cycle, and
 operate the switch circuit to couple the first sensing capacitor to the second voltage level and the second sensing capacitor to the first voltage level during a second phase of the first cycle,
 operate the switch circuit to couple the reference capacitor to one voltage level during the first phase of a second cycle,
 operate the switch circuit to couple the reference capacitor to another voltage level during the second phase of the second cycle.

13. Apparatus according to claim 12, wherein the switch control operates the switch circuit through $N_A$ first cycles and $N_B$ second cycles such that an integrated charge supplied by the first and second sensing capacitors balances an integrated charge supplied by the reference capacitor, and $$\frac{C_1 - C_2}{C_{REF}} = \frac{N_B}{N_A}.$$

14. An industrial process control transmitter arranged to be coupled to a central station by a two-wire communication link, the transmitter including:
- a transceiver coupled to the communication link for transmitting information to the central station and for receiving information from the central station;
- a processor coupled to the transceiver for processing information;
- a process variable sensor comprising:
  - a first sensing capacitor having a capacitance, $C_1$, based on the process variable
  - a second sensing capacitor having a capacitance, $C_2$, based on the process variable, and
  - a bridge node coupling a first side of the first sensing capacitor to a first side of the second sensing capacitor;
- a reference capacitor having a capacitance, $C_{REF}$, greater than an expected maximum difference between the capacitances of the first and second sensing capacitors;
- a summing node coupled to a first side of the reference capacitor and the bridge node;
- an excitation source supplying at least first and second voltage levels;
- a switch circuit selectively coupling a second side of each of the first and second sensing capacitors to the excitation source to derive a representation of $C_1-C_2$ at the bridge node and selectively coupling a second side of the reference capacitor to the excitation source to derive first and second charges at the summing node during mutually exclusive cycles; and
- a delta sigma converter coupled to the bridge node for supplying digital information signals to the processor representative of the difference between the capacitances of the first and second capacitors.

15. The industrial process control transmitter according to claim 14, wherein the switch circuit comprises:
- a first switch selectively coupling the second side of the first sensing capacitor to the first and second voltage levels,
- a second switch selectively coupling a second side of the second sensing capacitor to the first and second voltage levels, and
- a switch control coupled to operate the first and second switches during a first phase to couple the first sensing capacitor to the first voltage level and the second sensing capacitor to the second voltage level, and to operate the first and second switches during a second phase to couple the first sensing capacitor to the second voltage level and the second sensing capacitor to the first voltage level.

16. The industrial process control transmitter according to claim 14, wherein the switch circuit comprises:
- a first switch selectively coupling the second side of the first sensing capacitor to the first and second voltage levels,
- a second switch selectively coupling a second side of the second sensing capacitor to the first and second voltage levels, and
- a third switch selectively coupling a second side of the reference capacitor to one of two voltage levels of the excitation source.

17. The industrial process control transmitter according to claim 16, further including a switch control coupled to the first, second and third switches and so disposed and arranged to
- operate the third switch to couple the reference capacitor to one voltage level during the first phase of a first cycle and during the second phase of a second cycle, and couple the reference capacitor to another voltage level during the first phase of the second cycle and during the second phase of the first cycle,
- operate the first and second switches to couple the first sensing capacitor to the first voltage level and the second sensing capacitor to the second voltage level during a first phase of each cycle, and
- operate the first and second switches to couple the first sensing capacitor to the second voltage level and the second sensing capacitor to the first voltage level during a second phase of each cycle.

18. The industrial process control transmitter according to claim 17, wherein the switch control operates the first, second and third switches through $N_A$ first cycles and $N_B$ second cycles such that an integrated charge supplied by the first and second sensing capacitors balances an integrated charge supplied by the reference capacitor, and $$\frac{C_1 - C_2}{C_{REF}} = \frac{N_A - N_B}{N_A + N_B}.$$

19. The industrial process control transmitter according to claim 16, further including a switch control coupled to the first, second and third switches and so disposed and arranged to
- operate the first and second switches to couple the first sensing capacitor to the first voltage level and the second sensing capacitor to the second voltage level during a first phase of a first cycle,
- operate the first and second switches to couple the first sensing capacitor to the second voltage level and the second sensing capacitor to the first voltage level during a second phase of the first cycle, and
- operate the third switch to couple the reference capacitor to one voltage level during the first phase of a second cycle, and couple the reference capacitor to another voltage level during the second phase of the second cycle.

20. The industrial process control transmitter according to claim 19, wherein the switch control operates the first, second and third switches through $N_A$ first cycles and $N_B$ second cycles such that an integrated charge supplied by the first and second sensing capacitors balances an integrated charge supplied by the reference capacitor, and $$\frac{C_1 - C_2}{C_{REF}} = \frac{N_B}{N_A}.$$

21. A process for measuring a process variable comprising steps of:
- applying the process variable to first and second sensor capacitors to derive first and second capacitances, $C_1$ and $C_2$ respectively, based on the process variable;
- providing a reference capacitor having a reference capacitance, $C_{REF}$, larger than a difference between the capacitances of the first and second capacitors;

deriving a first charge representative of $C_1-C_2$;

deriving a second charge representative of $C_{REF}$; and integrating the first and second charges.

22. The process of claim 21, wherein the first and second and capacitors are coupled together, and an excitation source supplies a plurality of voltages, the process further comprises steps of:

defining first and second phases of each cycle, applying a first voltage to the first capacitor and a second voltage to the second capacitor during the first phase of each cycle, applying the second voltage to the first capacitor and the first voltage to the second capacitor during the second phase of each cycle, applying a voltage to the reference capacitor during the first phase of the first cycle and during the second phase of the second cycle, and applying another voltage to the reference capacitor during the first phase of the second cycle and during the second phase of the first cycle.

23. The process of claim 21, wherein the first and second and capacitors are coupled together, and an excitation source supplies a plurality of voltages, the process further comprises steps of:

defining first and second phases of each cycle, applying a first voltage to the first capacitor and a second voltage to the second capacitor during the first phase of a first cycle, applying the second voltage to the first capacitor and the first voltage to the second capacitor during the second phase of the first cycle, applying a voltage to the reference capacitor during the first phase of the second cycle, and applying another voltage to the reference capacitor during the second phase of the second cycle.

24. The industrial process control transmitter according to claim 14, further including a switch control coupled to the switch circuit to operate the switch circuit through $N_A$ first cycles and $N_B$ second cycles such that an integrated charge supplied by the first and second sensing capacitors balances an integrated charge supplied by the reference capacitor, and $$\frac{C_1 - C_2}{C_{REF}} = \frac{N_A - N_B}{N_A + N_B}.$$

25. The industrial process control transmitter according to claim 14, further including a switch control coupled to the switch circuit to operate the switch circuit through $N_A$ first cycles and $N_B$ second cycles such that an integrated charge supplied by the first and second sensing capacitors balances an integrated charge supplied by the reference capacitor, and $$\frac{C_1 - C_2}{C_{REF}} = \frac{N_B}{N_A}.$$

* * * * *